United States Patent
Kagawa (10) Patent No.: US 9,631,130 B2
(45) Date of Patent: Apr. 25, 2017

(54) HEAT-DISSIPATING SHEET HAVING HIGH THERMAL CONDUCTIVITY AND ITS PRODUCTION METHOD

(71) Applicant: Seiji Kagawa, Koshigaya (JP)

(72) Inventor: Seiji Kagawa, Koshigaya (JP)

(*) Notice: Subject to any disclaimer, the term of this patent is extended or adjusted under 35 U.S.C. 154(b) by 119 days.

(21) Appl. No.: 14/535,979

(22) Filed: Nov. 7, 2014

(65) Prior Publication Data
US 2015/0315450 A1   Nov. 5, 2015

(30) Foreign Application Priority Data
May 2, 2014   (JP) .................................. 2014-95419

(51) Int. Cl.
| C01B 31/04 | (2006.01) |
| C09K 5/14 | (2006.01) |
| C09K 5/08 | (2006.01) |
| H01L 23/373 | (2006.01) |
| H01L 23/36 | (2006.01) |

(52) U.S. Cl.
CPC ............ C09K 5/14 (2013.01); C01B 31/0484 (2013.01); H01L 23/373 (2013.01); H01L 23/3737 (2013.01); H01L 2924/0002 (2013.01); Y10T 428/31938 (2015.04)

(58) Field of Classification Search
None
See application file for complete search history.

(56) References Cited

U.S. PATENT DOCUMENTS

| 5,863,467 A | 1/1999 | Mariner et al. |
| 7,550,097 B2 | 6/2009 | Tonapi et al. |
| 2005/0045855 A1 | 3/2005 | Tonapi et al. |
| 2006/0246276 A1* | 11/2006 | Chung ................... F28F 13/00 428/323 |
| 2014/0130540 A1 | 5/2014 | Burk et al. |

(Continued)

FOREIGN PATENT DOCUMENTS

| DE | 10 2011 079 581 A1 | 1/2013 |
| EP | 2 426 096 A1 | 3/2012 |
| JP | 11-1621 A | 1/1999 |

(Continued)

OTHER PUBLICATIONS

Englisah translation of KR 2014/0079635 (2014).*

(Continued)

*Primary Examiner* — Yoshitoshi Takeuchi
(74) *Attorney, Agent, or Firm* — Birch, Stewart, Kolasch & Birch, LLP (57) ABSTRACT

A heat-dissipating sheet having a density of 2.0 g/cm³ or more and an in-plane thermal conductivity of 580 W/mK or more, which comprises carbon black uniformly dispersed among fine graphite particles, a mass ratio of fine graphite particles to carbon black being 75/25 to 95/5, and the carbon black being composed of channel black and ketjen black and/or acetylene black is produced by applying a dispersion of fine graphite particles, carbon black and an organic binder in an organic solvent to a surface of a die, drying it; burning the resultant resin-containing composite sheet to remove the organic binder; and then pressing the resultant composite sheet of fine graphite particles and carbon black for densification.

3 Claims, 8 Drawing Sheets

(56) References Cited

U.S. PATENT DOCUMENTS

2014/0190676 A1* 7/2014 Zhamu .................. F28F 21/02
                                                                              165/185

FOREIGN PATENT DOCUMENTS

| | | | |
|---|---|---|---|
| JP | 2006-86271 A | 3/2006 | |
| JP | 2006-306068 A | 11/2006 | |
| JP | 2012-136575 A | 7/2012 | |
| JP | 2012-211259 A | 11/2012 | |
| KR | 2014/0079635 * | 6/2014 | ............... B32B 7/12 |
| WO | WO 2005/024942 A1 | 3/2005 | |

OTHER PUBLICATIONS

Extended European Search Report issued Aug. 20, 2015, in European Patent Application No. 14192452.2.

Hu, K. and D. D. L. Chung, "Flexible graphite modified by carbon black paste for use as a thermal interface material," Carbon (2010), vol. 49, pp. 1075-1086.

King et al., "Effects of Carbon Fillers in Thermally Conductive Polypropylene Based Resins," Polymer Composites (Apr. 7, 2009), vol. 31, No. 3, pp. 497-506.

\* cited by examiner

HEAT-DISSIPATING SHEET HAVING HIGH THERMAL CONDUCTIVITY AND ITS PRODUCTION METHOD

FIELD OF THE INVENTION

The present invention relates to a heat-dissipating sheet having high thermal conductivity for efficiently dissipating heat generated from electronic parts, etc. in small electronic appliances such as note-type personal computers, smartphones, mobile phones, etc., and its production method.

BACKGROUND OF THE INVENTION

In small electronic appliances such as note-type personal computers, smartphones, mobile phones, etc., which have been provided with increasingly higher performance and more functions, electronic devices such as microprocessors, imaging chips, memories, etc. should be mounted densely. Accordingly, to prevent malfunction due to heat generated by them, the dissipation of heat generated from such electronic devices has become increasingly important.

As a heat-dissipating sheet for electronic devices, JP 2006-306068 A discloses a heat-conductive sheet comprising at least a graphite film and an adhesive resin composition, which is a reaction-curable vinyl polymer. The graphite film is (a) expanded graphite formed by an expanding method, or (b) obtained by heat-treating a polyimide film, etc., at a temperature of 2400° C. or higher. The expanded graphite film is obtained by immersing graphite in acid such as sulfuric acid, etc. to form a graphite interlayer compound, heat-treating the graphite interlayer compound to foam it, thereby separating graphite layers, washing the resultant graphite powder to remove acid, and rolling the resultant thin-film graphite powder. However, the expanded graphite film has insufficient strength. Also, the graphite film obtained by the heat treatment of a polyimide film, etc. is disadvantageously expensive despite high heat dissipation.

JP 2012-211259 A discloses a heat-conductive sheet comprising graphite pieces, which comprise pluralities of first graphite pieces obtained by thinly cutting a thermally decomposed graphite sheet, and second graphite pieces smaller than the widths of the first graphite pieces, at least the first graphite pieces connecting both surfaces of the heat-conductive sheet. This heat-conductive sheet is obtained, for example, by blending the first and second graphite pieces with a mixture of an acrylic polymer and a solvent, and extruding the resultant blend. However, the extruded heat-conductive sheet does not have sufficient heat dissipation, because of a high volume fraction of the resin.

JP 2006-86271 A discloses a heat-dissipating sheet as thick as 50-150 μm comprising graphite bonded by an organic binder having a glass transition temperature of −50° C. to +50° C., such as an amorphous copolyester, a mass ratio of graphite/binder resin being 66.7/33.3 to 95/5. This heat-dissipating sheet is produced by applying a slurry of graphite and an organic binder in an organic solvent to a parting-agent-coated film on the side of a parting layer, drying the slurry by hot air to remove the organic solvent, and then pressing it, for example, at 30 kg/cm². JP 2006-86271 A describes that the pressing of a graphite/organic binder sheet improves its thermal conductivity. However, because this heat-dissipating sheet contains an organic binder, it does not sufficiently exhibit high thermal conductivity inherent in graphite.

JP 11-1621 A discloses a high-thermal-conductivity, solid composite material for a heat dissipater comprising highly oriented graphite flakes and a binder polymer polymerized under pressure. This solid composite material is produced by mixing graphite flakes with a thermosetting monomer such as an epoxy resin to prepare a composition comprising at least 40% by volume of graphite, and polymerizing the monomer while compressing the composition under sufficient pressure to align graphite substantially in parallel. However, because this solid composite material comprises an epoxy resin, it does not have sufficiently high thermal conductivity.

JP 2012-136575 A discloses a conductive, heat-dissipating sheet comprising organic particles made of polyamides, acrylic resins, etc. and having an average particle size of about 0.1-100 μm, conductive inorganic fillers having an average particle size of about 10 nm to about 10 μm, and a cured resin such as an epoxy resin, etc., organic particles/inorganic fillers being 1000/1 to 10/1, and the percentage of inorganic fillers being 5-30% by weight based on the total amount. JP 2012-136575 A illustrates graphite, coke, carbon black, etc. as inorganic fillers, though only carbon black is used in Examples. In addition, this conductive heat-dissipating sheet does not have sufficient heat dissipation, because it contains the cured resin.

As described above, conventional heat-dissipating sheets containing graphite or carbon black do not have sufficient heat dissipation because they also contain binder resins. Increase in the percentage of graphite or carbon black results in lower sheet strength despite improved thermal conductivity, particularly causing the problem of easy detachment of graphite or carbon black from the heat-dissipating sheet. Accordingly, inexpensive heat-dissipating sheets having uniform, high heat dissipation as well as mechanical properties necessary for handling are desired.

OBJECT OF THE INVENTION

Accordingly, an object of the present invention is to provide an inexpensive heat-dissipating sheet having high heat dissipation as well as mechanical properties necessary for handling, and its production method.

DISCLOSURE OF THE INVENTION

As a result of intensive research in view of the above object, the inventor has found that (a) a heat-dissipating sheet comprising a small amount of carbon black uniformly dispersed among fine graphite particles has high thermal conductivity, as well as sufficient mechanical properties for handling, with substantially no detachment of fine graphite particles and carbon black; that (b) such heat-dissipating sheet is obtained by forming a sheet comprising fine graphite particles and carbon black dispersed in a small amount of an organic binder, burning the sheet to remove the organic binder, and pressing the resultant composite sheet of graphite and carbon black for densification; and that (c) when a mixture of channel black and ketjen black and/or acetylene black is used as carbon black, the resultant heat-dissipating sheet has improved thermal conductivity and mechanical properties. The present invention has been completed based on such findings.

Thus, the heat-dissipating sheet of the present invention has a structure in which carbon black is uniformly dispersed among fine graphite particles, a mass ratio of fine graphite particles to carbon black being 75/25 to 95/5;

the carbon black being composed of channel black and ketjen black and/or acetylene black; and the heat-dissipating sheet having a density of 2.0 g/cm$^3$ or more and an in-plane thermal conductivity of 580 W/mK or more.

A mass ratio of channel black to ketjen black and/or acetylene black is preferably 4/1 to 1/3.

The heat-dissipating sheet preferably has thickness of 25-150 μm.

The fine graphite particles preferably have an average diameter of 3-150 μm and average thickness of 200 nm or more.

The carbon black preferably has an average primary particle size of 20-200 nm.

The heat-dissipating sheet is preferably coated with insulating resin layers or insulating plastic films.

The method of the present invention for producing the above heat-dissipating sheet comprises the steps of (1) preparing a dispersion of fine graphite particles, carbon black and an organic binder in an organic solvent, a mass ratio of the fine graphite particles to the carbon black being 75/25 to 95/5, and the carbon black being composed of channel black and ketjen black and/or acetylene black; (2) casting the dispersion into a cavity of a lower die plate and then drying it to form a resin-containing composite sheet comprising the fine graphite particles, the carbon black and the organic binder; (3) burning the resin-containing composite sheet to remove the organic binder to form a composite sheet of fine graphite particles and carbon black; and (4) pressing the lower die plate combined with an upper die plate to densify the composite sheet of fine graphite particles and carbon black.

The dispersion preferably comprises 5-25% by mass in total of fine graphite particles and carbon black, and 0.5-2.5% by mass of the organic binder.

A mass ratio of the organic binder to the total amount of the fine graphite particles and the carbon black is preferably 0.01-0.5.

The organic binder is preferably an acrylic resin, a polystyrene resin or polyvinyl alcohol.

The organic solvent is preferably at least one selected from the group consisting of ketones, aromatic hydrocarbons and alcohols.

The burning step is preferably conducted at a temperature of 550-700° C.

Cooling to room temperature after burning is preferably gradually conducted over 1 hour or more.

The pressing step is preferably conducted, after the composite sheet of fine graphite particles and carbon black is cooled to a temperature equal to or lower than the freezing point of water.

The pressing step is preferably conducted at pressure of 20 MPa or more.

The resin-containing composite sheet formed in the lower die plate cavity is preferably burned without being peeled from the lower die plate, and then pressed with the lower die plate combined with the upper die plate.

The pressing step is preferably conducted at a temperature in a range of room temperature to 200° C.

DESCRIPTION OF THE PREFERRED EMBODIMENTS

The embodiments of the present invention will be explained in detail below referring to the attached drawings.

Explanations of each embodiment are applicable to other embodiments unless otherwise mentioned. Explanations below are not restrictive, but various modifications may be made within the scope of the present invention.

[1] Heat-Dissipating Sheet

Figure 1:
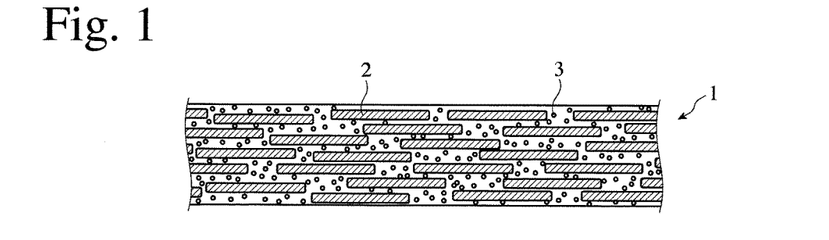
FIG. 1 is a schematic cross-sectional view showing the structure of a heat-dissipating sheet composed of fine graphite particles and carbon black.

As shown in FIG. 1, the heat-dissipating sheet 1 of the present invention is substantially composed only of fine graphite particles 2, and carbon black 3 uniformly dispersed among fine graphite particles 2. The term "substantially composed only of" means that the heat-dissipating sheet 1 of the present invention obtained by burning and pressing a composite sheet of fine graphite particles, carbon black and an organic binder does not contain other components than fine graphite particles and carbon black except for burned residues. Though gaps between fine graphite particles 2 and carbon black 3 are exaggerated in FIG. 1 for clarity, the fine graphite particles 2 and the carbon black 3 are actually bonded closely with substantially no gaps.

(1) Fine Graphite Particles

A fine graphene particle has a flake- or plate-like, multilayer structure, in which benzene rings are two-dimensionally connected. Because the fine graphene particle has a hexagonal lattice structure, each carbon atom is bonded to three carbon atoms, one of four peripheral electrons used for chemical bonding being in a free state (free electron). Because free electrons can move along the crystal lattice, fine graphene particles have high thermal conductivity.

Figure 2:
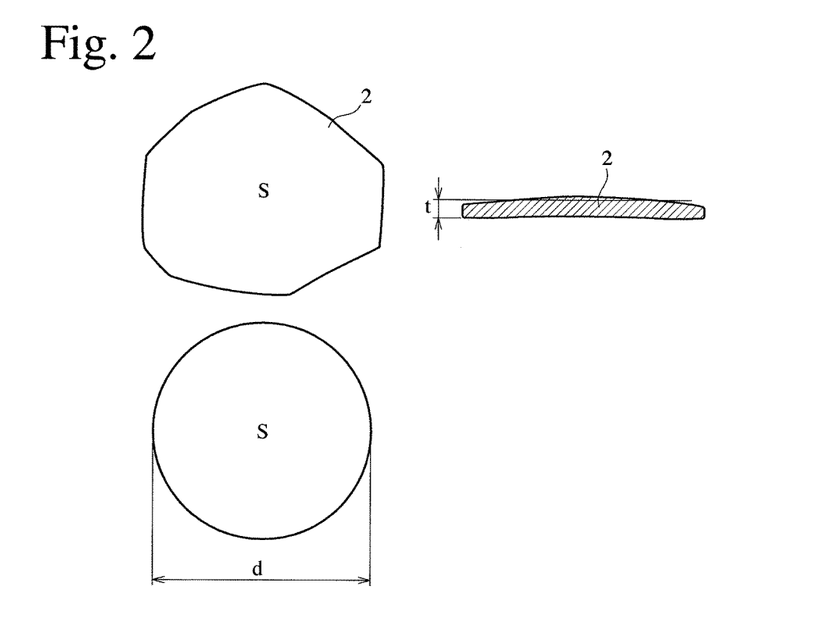
FIG. 2 is a cross-sectional view showing a method for determining the particle size of a fine graphite particle.

Because a fine graphene particle has a flake- or plate-like shape, its size is represented by the diameter of its planar surface. Because a flake-like, fine graphene particle 2 has a planar contour of an irregular shape as shown in FIG. 2, the size (diameter) of each fine graphene particle 2 is defined as a diameter d of a circle having the same area S. Because the size of each fine graphene particle 2 is expressed by a diameter d and a thickness t, the average diameter of fine graphene particles 2 used is expressed by $(\Sigma d)/n$, wherein n represents the number of fine graphene particles 2 measured, and the average thickness of fine graphene particles 2 is expressed by $(\Sigma t)/n$. The diameters d and thickness t of fine graphene particles 2 can be determined by the image treatment of photomicrographs of fine graphene particles 2.

The average diameter of fine graphene particles 2 used in the present invention is preferably in a range of 3-150 μm. When the average diameter of fine graphene particles 2 is less than 3 μm, bonded carbon atoms are not sufficiently long, providing a heat-dissipating sheet 1 with too small thermal conductivity. On the other hand, fine graphene particles 2 having an average diameter of more than 150 μm would make spray coating difficult. The average diameter of fine graphene particles 2 is more preferably 5-100 μM, further preferably 5-50 μm, most preferably 10-30 μm. The average thickness of fine graphene particles 2 is preferably 200 nm or more, more preferably 200 nm to 5 μm, most preferably 200 nm to 1 μm.

(2) Carbon Black

Carbon black 3 used in the present invention is constituted by channel black and ketjen black and/or acetylene black. The mass ratio of channel black to ketjen black and/or acetylene black is preferably 4/1 to 1/3. Within this mass ratio range, the heat-dissipating sheet 1 has high thermal conductivity and good mechanical properties (tensile strength, bendability and cuttability). The more preferred mass ratio of channel black to ketjen black and/or acetylene black is 3/1 to 1/2. Incidentally, the mass ratio of ketjen black to acetylene black may be from 0% to 100%.

Carbon black 3 preferably has an average primary particle size of 20-200 nm. With carbon black 3 having an average primary particle size of less than 20 nm, agglomeration is likely to occur, making difficult the uniform dispersion of carbon black 3 among fine graphite particles 2. Carbon black 3 having an average primary particle size of more than 200 nm is too large to be uniformly dispersed among fine graphite particles 2. The average primary particle size of carbon black 3 is more preferably 30-100 nm, most preferably 30-80 nm.

(3) Mass Ratio

The mass ratio of fine graphite particles to carbon black is 75/25 to 95/5. Within the above mass ratio range of fine graphite particles to carbon black, a heat-dissipating sheet having as high in-plane thermal conductivity as 580 W/mK or more and sufficient mechanical properties (tensile strength, bendability and cuttability) for handling can be obtained. When fine graphite particles is more than 95% by mass (carbon black is less than 5% by mass), their total amount being 100% by mass, a sufficient effect of adding carbon black cannot be obtained. On the other hand, when fine graphite particles are less than 75% by mass (carbon black is more than 25% by mass), a heat-dissipating sheet having an in-plane thermal conductivity of 580 W/mK or more cannot be obtained. The mass ratio of fine graphite particles to carbon black is preferably 80/20 to 95/5, more preferably 82.5/17.5 to 90/10.

(4) Thickness

To secure sufficient cooling power, the heat-dissipating sheet is preferably as thick as 25-150 μm. When it is thinner than 25 μm, the heat-dissipating sheet has insufficient cooling power despite high thermal conductivity. Even if the heat-dissipating sheet were thicker than 150 μm, further improvement in the cooling power would not be expected. The preferred thickness of the heat-dissipating sheet is 40-100 μm for practical purposes.

(5) Density

The heat-dissipating sheet of the present invention has a density of 2.0 g/cm³ or more. Because fine graphite particles have a density of 2.25±0.05 g/cm³, the heat-dissipating sheet of the present invention has a density extremely close to that of fine graphite particles, thereby having thermal conductivity close to the inherent thermal conductivity of graphite. The density of the heat-dissipating sheet of the present invention is preferably 2.1-2.25 g/cm³.

(6) Thermal Conductivity

As described above, because the heat-dissipating sheet of the present invention has a structure in which carbon black composed of channel black and ketjen black and/or acetylene black is uniformly dispersed among fine graphite particles, and has a density of 2.0 g/cm³ or more, it has thermal conductivity of 580 W/mK or more in an in-plane direction. The thermal conductivity in an in-plane direction may be called simply "in-plane thermal conductivity." The "in-plane direction" is an XY direction in parallel with a surface (XY plane) of the heat-dissipating sheet, and the "thickness direction" is a Z direction perpendicular to the XY plane. The heat-dissipating sheet of the present invention preferably has thermal conductivity of 620 W/mK or more in an in-plane direction, and about 10 W/mK or more in a thickness direction.

[2] Production Method of Heat-Dissipating Sheet (1) Preparation of Dispersion

A dispersion of fine graphite particles, carbon black composed of channel black and ketjen black and/or acetylene black, and an organic binder in an organic solvent is first prepared. Because fine graphite particles are easily agglomerated, it is preferable to mix a dispersion of fine graphite particles in an organic solvent with a dispersion of carbon black in an organic solvent and a solution of an organic binder in an organic solvent. With the entire dispersion as 100% by mass, the total amount of fine graphite particles and carbon black is preferably 5-25% by mass. When the total amount of fine graphite particles and carbon black is less than 5% by mass, too thin a resin-containing composite sheet is obtained by one operation. On the other hand, when the total amount of fine graphite particles and carbon black is more than 25% by mass, the concentrations of fine graphite particles and carbon black are too high in the dispersion, likely causing agglomeration. The more preferred total amount of fine graphite particles and carbon black is 8-20% by mass, as long as the mass ratio of fine graphite particles to carbon black is in a range of 75/25 to 95/5 as described above.

The mass ratio of the organic binder to the total amount of fine graphite particles and carbon black is preferably 0.01-0.5. When the mass ratio of organic binder/(fine graphite particles+carbon black) is less than 0.01, the resultant resin-containing composite sheet is not sufficiently integral, making its handling difficult. When the above mass ratio is more than 0.5, it takes too much time to burn off the organic binder in a subsequent burning step, and fine graphite particles are insufficiently oriented. The mass ratio of organic binder/(fine graphite particles+carbon black) is more preferably 0.02-0.3, most preferably 0.03-0.2.

The organic binder used in the present invention is not particularly restricted, as long as it can be dissolved in an organic solvent to uniformly disperse fine graphite particles and carbon black, and easily removed by burning. Such organic binders include, for example, acrylic resins such as polymethylacrylate and polymethylmethacrylate, polystyrenes, polycarbonates, polyvinyl chloride, ABS resins, etc. Among them, polymethylmethacrylate and polystyrenes are preferable.

The organic solvent used in the dispersion is preferably an organic solvent capable of well dispersing fine graphite particles and carbon black and dissolving an organic binder, and volatile enough to shorten the drying time. Examples of such organic solvents include ketones such as methyl ethyl ketone, aliphatic hydrocarbons such as hexane, aromatic hydrocarbons such as xylene, alcohols such as isopropyl alcohol, etc. They may be used alone or in combination.

(2) Casting of Dispersion (a) First Example

Figure 3:
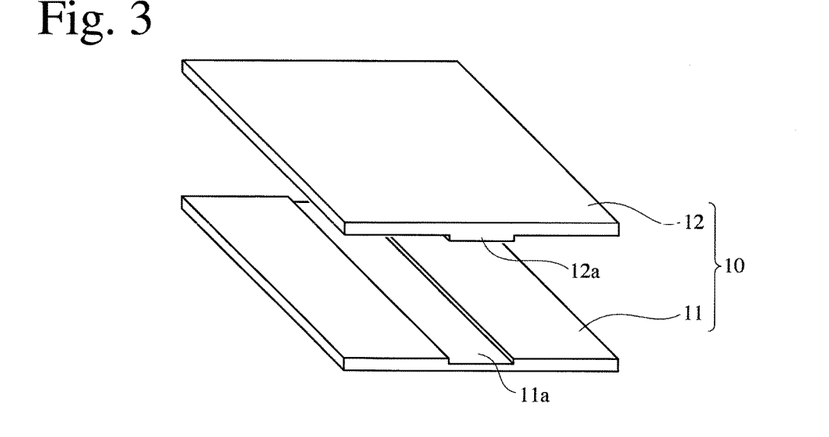
FIG. 3 is a perspective view showing an example of planar die apparatuses for forming a resin-containing composite sheet from a dispersion of fine graphite particles, carbon black and an organic binder in an organic solvent, and burning it.
Figure 4:
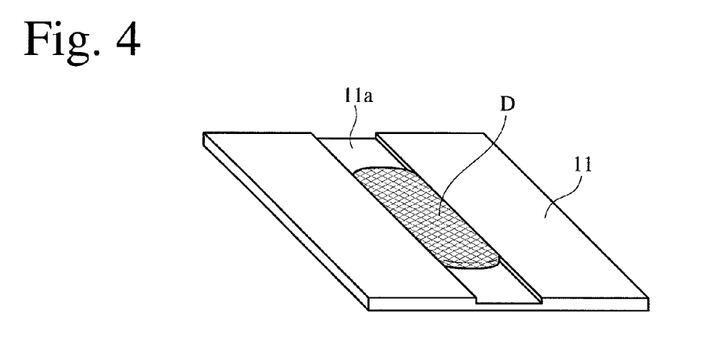
FIG. 4 is a perspective view schematically showing a dispersion cast into a cavity of a lower die plate shown in FIG. 3.

FIG. 3 shows a first example of planar die apparatuses for casting the dispersion. This planar die apparatus 10 comprises a lower die plate 11 having a flat cavity 11a extending between opposing sides, and an upper die plate 12 having a projection 12a having a complementary shape to the cavity 11a. Because the dispersion D used in the present invention is relatively viscous, it can be cast to a substantially rectangular shape with the cavity 11a having both open ends as shown in FIG. 4. The thickness of the cast dispersion D can be made uniform by a doctor blade method.

(b) Second Example

Figure 5A:
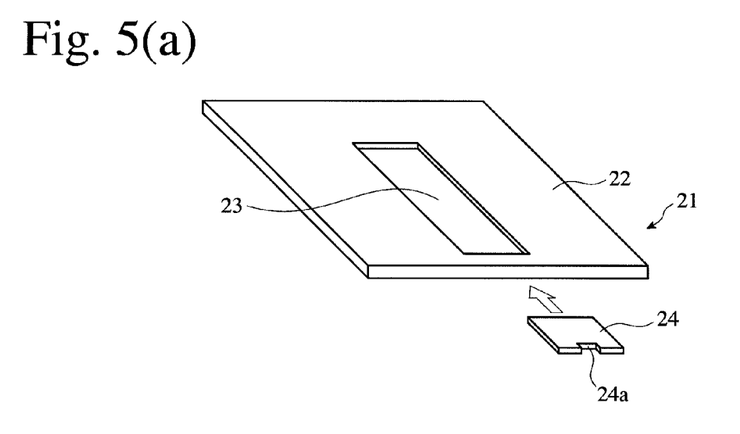
FIG. 5(a) is an exploded perspective view showing another example of lower die plates in a planar die apparatus for forming a resin-containing composite sheet from a dispersion of fine graphite particles, carbon black and an organic binder in an organic solvent, and burning it.
Figure 5B:
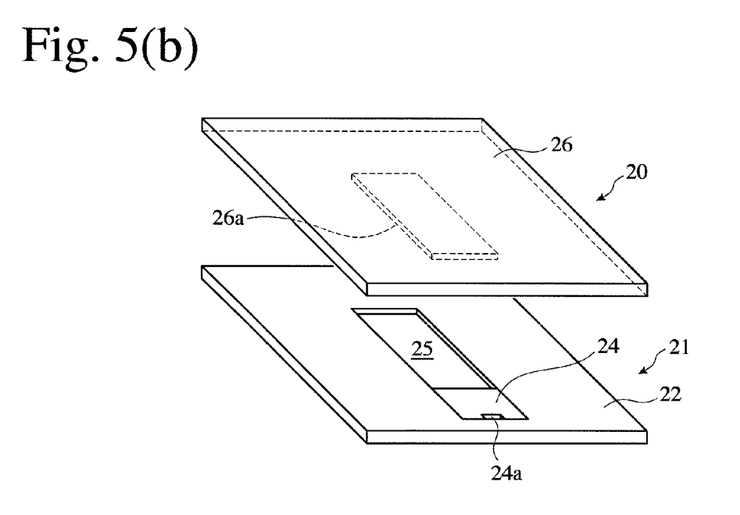
FIG. 5(b) is an exploded perspective view showing an example of combinations of the lower die plate of FIG. 5(a) with an upper die plate.
Figure 6:
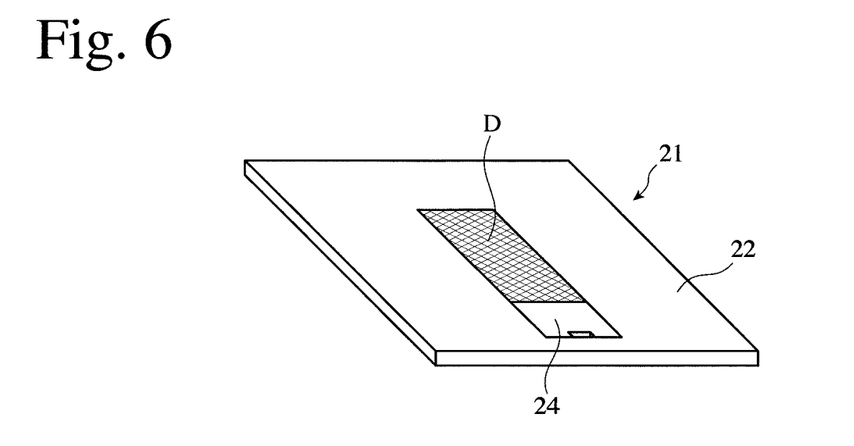
FIG. 6 is a perspective view schematically showing a dispersion cast in the lower die plate of FIG. 5(b).

FIGS. 5(a) and 5(b) show a second example of planar die apparatuses. A lower die plate 21 in this planar die apparatus 20 comprising a lower die plate body 22 having a rectangular, flat recess 23, and a plate member 24 placed in the recess 23 on one side. The plate member 24 has the same thickness as the depth of the recess 23, and is provided with a notch 24a on the side of a side surface of the recess 23. As shown in FIG. 5(b), the plate member 24 is placed in the recess 23 of the lower die plate body 22 to form a cavity 25. As shown in FIG. 5(b), an upper die plate 26 has a projection 26a complementary to the cavity 25. After the dispersion D is cast into the cavity 25 of the lower die plate 21, an excessive dispersion is removed by a doctor blade method to have uniform thickness as shown in FIG. 6. Because the plate member 24 has the notch 24a, it can be easily taken out of the recess 23, using a tool. Accordingly, a composite sheet C of fine graphite particles and carbon black finally obtained can be easily taken out of the cavity 25 by removing the plate member 24.

(c) Third Example

Figure 7A:
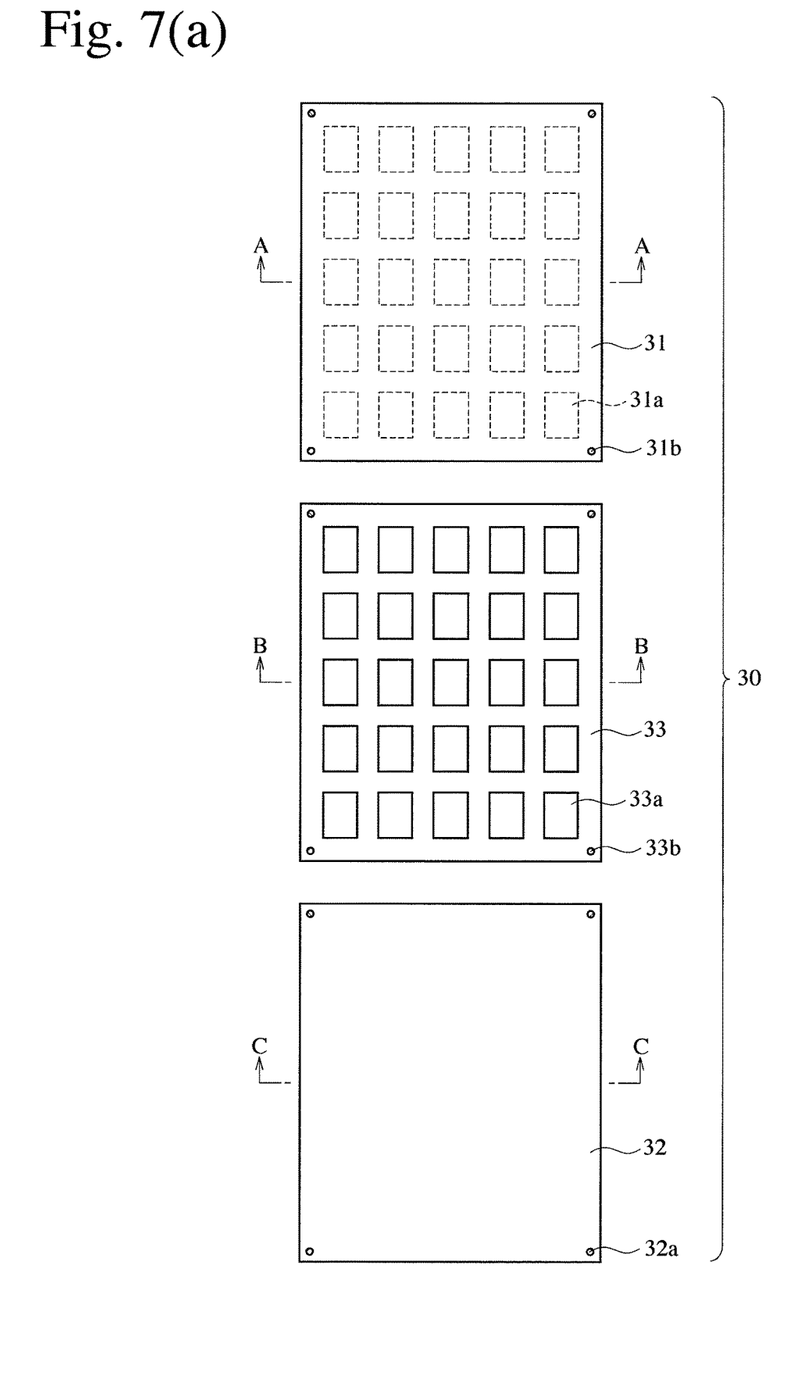
FIG. 7(a) is an exploded plan view showing a further example of planar die apparatuses usable in the present invention.
Figure 7B:
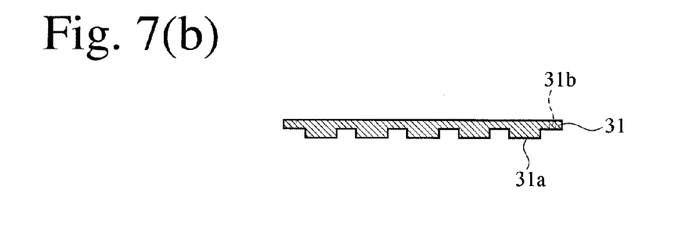
FIG. 7(b) is a cross-sectional view taken along the line A-A in FIG. 7(a).
Figure 7C:
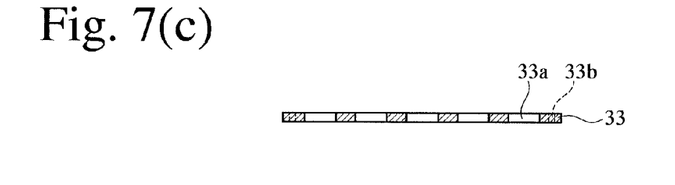
FIG. 7(c) is a cross-sectional view taken along the line B-B in FIG. 7(a).
Figure 7D:
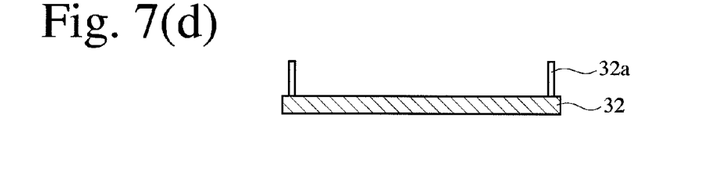
FIG. 7(d) is a cross-sectional view taken along the line C-C in FIG. 7(a).
Figure 7E:
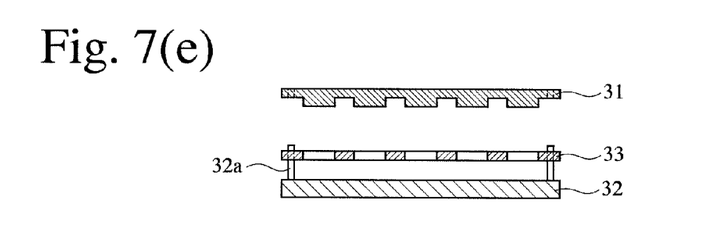
FIG. 7(e) is an exploded cross-sectional view showing a combination of an upper die plate, an intermediate die plate and a lower die plate constituting the planar die apparatus of FIG. 7(a).
Figure 7F:
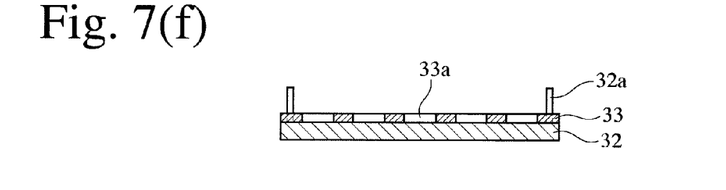
FIG. 7(f) is a cross-sectional view showing a cavity obtained by combining a lower die plate and an intermediate die plate in the planar die apparatus of FIG. 7(a).
Figure 8:
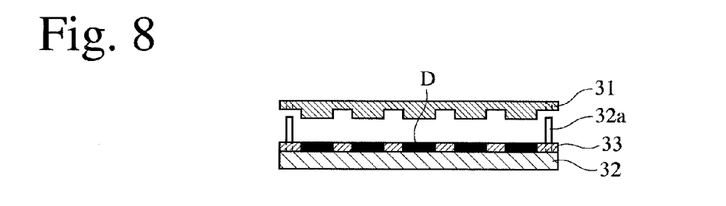
FIG. 8 is a cross-sectional view showing a dispersion cast into the cavity of FIG. 7(f), and made uniform in thickness by removing an excessive dispersion by a doctor blade method.

FIGS. 7(a)-7(f) show a third example of planar die apparatuses. This planar die apparatus 30 comprises an upper die plate 31 having pluralities of flat rectangular projections 31a on one surface, a flat lower die plate 32, and an intermediate die plate 33 placed on the lower die plate 32. The intermediate die plate 33 has pluralities of rectangular openings 33a each having a complementary shape to that of the rectangular projection 31a of the upper die plate 31. The lower die plate 32 has positioning pins 32a at four corners, and the upper die plate 31 and the intermediate die plate 33 have holes 31b, 33b for receiving the positioning pins 32a at four corners. As shown in FIGS. 7(e) and 7(f), the pins 32a of the flat lower die plate 32 are inserted into the holes 33b of the intermediate die plate 33, and when the intermediate die plate 33 is placed on an upper surface of the lower die plate 32, each opening 33a of the intermediate die plate 33 constitutes a cavity. FIG. 8 shows a dispersion D cast into each cavity formed by the lower die plate 32 and the intermediate die plate 33, whose thickness is made uniform by removing an excessive dispersion by a doctor blade method. The third example is efficient, because pluralities of heat-dissipating sheets are simultaneously formed by one die plate. With each cavity corresponding to a final shape of the heat-dissipating sheet, the heat-dissipating sheets can be produced efficiently.

(3) Drying of Dispersion

Figure 9:
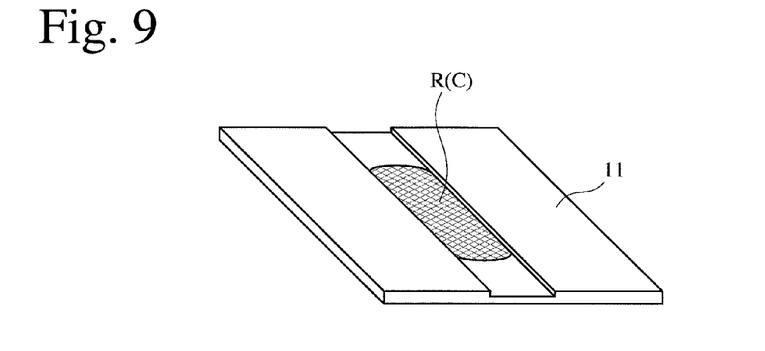
FIG. 9 is a perspective view showing a resin-containing composite sheet obtained by drying a dispersion of fine graphite particles and carbon black in an organic solvent cast into the cavity of the lower die plate of FIG. 4, and a composite sheet of fine graphite particles and carbon black obtained by burning the resin-containing composite sheet.

The dispersion D in the cavity of the lower die plate may be dried spontaneously, or by heating to shorten the drying time. The heating temperature may be determined depending on the boiling point of an organic solvent used. For example, when a mixed solvent of xylene and isopropyl alcohol, or methyl ethyl ketone is used, the heating temperature is preferably 30-100° C., more preferably 40-80° C. As shown in FIG. 9, the drying of the dispersion D provides a resin-containing composite sheet R attached to the cavity 11a of the lower die plate 11.

(4) Burning

To remove the organic binder, the resin-containing composite sheet R is preferably burned in a furnace (not shown), without being removed from the cavity 11a of the lower die plate 11. The furnace may be an electric furnace, a gas furnace, or a continuous furnace in which the resin-containing composite sheet R in the lower die plate 11 is conveyed on a belt conveyor. In the case of a continuous furnace, a gradually-cooling furnace is preferably positioned at the end of the continuous furnace, to secure gradual cooling described later.

The burning temperature is preferably 550-750° C. When the burning temperature is lower than 550° C., the removal of the organic binder takes too much time, and the resultant heat-dissipating sheet cannot have sufficiently high thermal conductivity. On the other hand, when the burning temperature is higher than 750° C., carbon black may be burned out at least partially, resulting in a heat-dissipating sheet with insufficient thermal conductivity. The preferred burning temperature is 600-700° C.

The resin-containing composite sheet R is burned preferably in an atmosphere sufficiently containing oxygen, for example, in the air. In an oxygen-containing atmosphere (air), the organic binder is rapidly burned out without leaving a carbonized binder. However, burning in an inert gas such as a nitrogen gas tends to carbonize the organic binder, providing a heat-dissipating sheet with low thermal conductivity. The oxygen content in the atmosphere is preferably 10% or more, more preferably 15% or more.

The burning time of the resin-containing composite sheet R in the above temperature range in an oxygen-containing atmosphere is generally 5-30 minutes, though variable depending on the burning temperature. The burning time is a time period in which the resin-containing composite sheet R is kept at the burning temperature, without including the temperature elevation time and the cooling time. When the burning time is less than 5 minutes, the organic binder is not completely burned out. When the burning time is more than 30 minutes, carbon black is excessively exposed to high temperatures, so that carbon black may be burned out at least partially, resulting in a heat-dissipating sheet with insufficient thermal conductivity. The preferred burning time is 7-15 minutes. The temperature elevation time is preferably 10-30 minutes.

(5) Cooling

A composite sheet C of fine graphite particles and carbon black formed by burning is preferably gradually cooled in the furnace. It has been found that when the composite sheet C of fine graphite particles and carbon black is left to cool outside the furnace, the resultant heat-dissipating sheet tends to have low thermal conductivity. The composite sheet C of fine graphite particles and carbon black is preferably gradually cooled over 1 hour or more in the furnace. The cooling speed is preferably 15° C./minute or less, more preferably 10° C./minute or less. Accordingly, the cooling time is preferably 1 hour or more.

It has been found that when the composite sheet C of fine graphite particles and carbon black is cooled to a temperature equal to or lower than the freezing point of water before pressing, the heat-dissipating sheet exhibits high thermal conductivity in a wide range of the carbon black content. The cooling temperature may be 0° C. or lower, and is preferably −5° C. or lower. When cooled to a temperature equal to or lower than the freezing point of water, moisture in the air is likely frozen on the composite sheet C. Accordingly, cooling is conducted preferably in a dry atmosphere. The cooling time is not particularly restricted, but may be 10 minutes or more.

(6) Pressing

Figure 10:
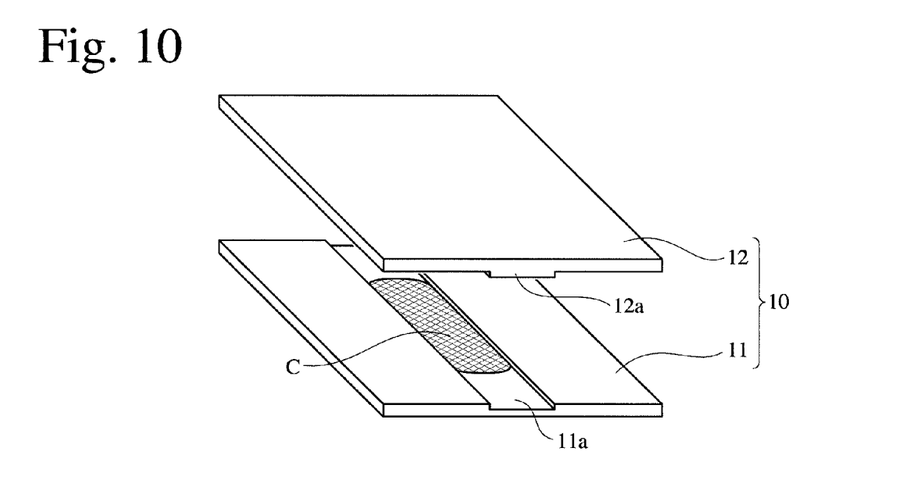
FIG. 10 is a perspective view showing a combination of a lower die plate having a composite sheet of fine graphite particles and carbon black in its cavity, with an upper die plate.
Figure 11:
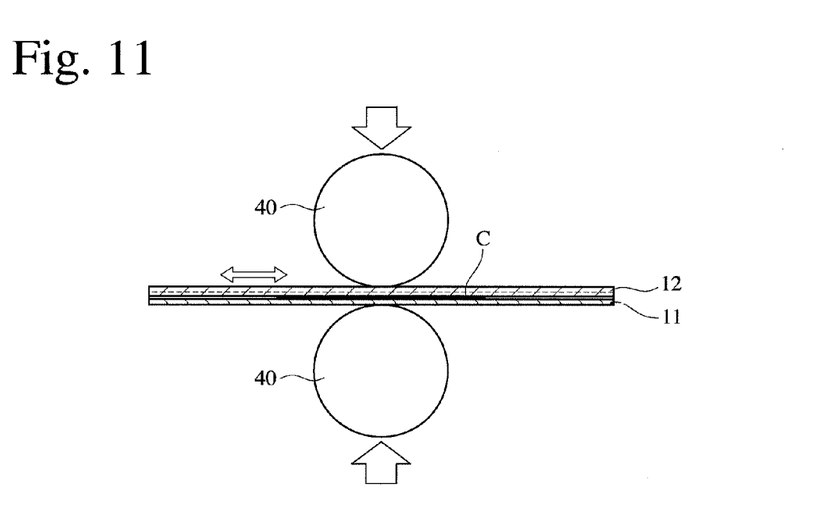
FIG. 11 is a partially cross-sectional side view showing the roll-pressing of a composite sheet of fine graphite particles and carbon black in a cavity of a planar die apparatus.

As shown in FIG. 10, a composite sheet C of fine graphite particles and carbon black obtained by burning the resin-containing composite sheet R attached to the cavity 11a of the lower die plate 11 is pressed by combining the lower die plate 11 with the upper die plate 12, such that the projection 12a of the upper die plate 12 is pressed onto the composite sheet C in the cavity 11a of the lower die plate 11. The lower die plate 11 and the upper die plate 12 may be pressed by a pressing apparatus, or by a pair of rolls 40, 40 with the composite sheet C sandwiched by the lower die plate 11 and the upper die plate 12 as shown in FIG. 11. Pressure applied to the lower die plate 11 and the upper die plate 12 is preferably 20 MPa or more. Pressing is not limited to once, but may be conducted plural times. Pressing may be conducted at room temperature, or at high temperature up to 200° C. to increase the pressing efficiency.

During pressing, the lower die plate 11 and the upper die plate 12 are preferably vibrated via rolls 40. Vibration promotes the densification of the composite sheet C of fine graphite particles and carbon black even under the same pressure. The vibration frequency may be about 100-500 Hz. Vibration may be added by a vibration motor.

Figure 12:
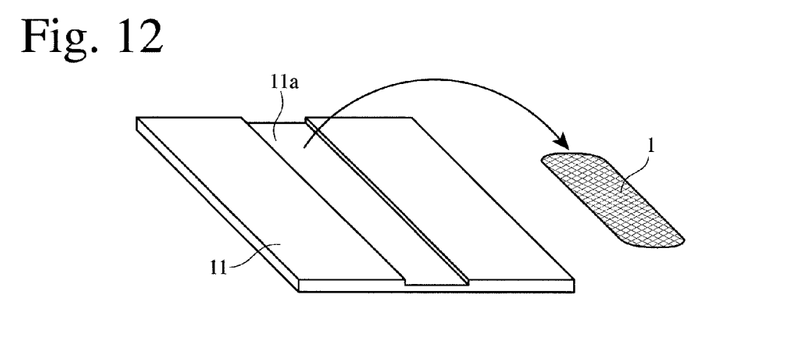
FIG. 12 is a perspective view showing the peeling of a heat-dissipating sheet obtained by pressing from a lower die plate.

The heat-dissipating sheet 1 obtained by pressing the composite sheet C of fine graphite particles and carbon black is peeled from the lower die plate 11 as shown in FIG. 12. Because of uniform dispersion of carbon black 3 among fine graphite particles 2 and densification by pressing, the heat-dissipating sheet 1 is neither broken nor cracked when peeled from the lower die plate 11. The heat-dissipating sheet 1 thus obtained has sufficient bendability, so that it is not broken or fractured even when bent, for example, to 90° with a radius of curvature of 2 cm.

(7) Cutting of Heat-Dissipating Sheet

When a large heat-dissipating sheet 1 is formed by the above process, it should be cut to a proper size so that it can be attached to a small electronic appliance. On the other hand, when a heat-dissipating sheet 1 having a use size is formed, its peripheral portion need only be trimmed. Because of uniform dispersion of carbon black 3 among fine graphite particles 2, the heat-dissipating sheet 1 of the present invention cut by an ordinary cutter has a sharp cut surface without raggedness.

(8) Surface coating of heat-dissipating sheet

The heat-dissipating sheet 1 of the present invention comprising fine graphite particles and carbon black is preferably coated with an insulating resin or a plastic film, to prevent the detachment of fine graphite particles and carbon black and to achieve surface insulation. The insulating resins are preferably thermoplastic resins soluble in organic solvents, for example, acrylic resins such as polymethylmethacrylate, polystyrenes, polycarbonates, polyvinyl chloride, polyurethanes, etc. The insulating plastic films may be made of polyolefins such as polyethylene and polypropylene, polyesters such as polyethylene terephthalate, polyamides such as nylons, polyimides, etc. The insulating plastic film preferably has a heat-sealing layer. As long as the functions of preventing the detachment of fine graphite particles and carbon black and adding insulation are exhibited, the thickness of the insulating resin coating and the insulating plastic film may be several micrometers to about 20 μm. Surface coating may be preferably conducted after cutting the heat-dissipating sheet 1 to a desired size, to surely prevent the detachment of fine graphite particles and carbon black from the cut surface of the heat-dissipating sheet 1.

[3] Heat Dissipation Test

Figure 13:
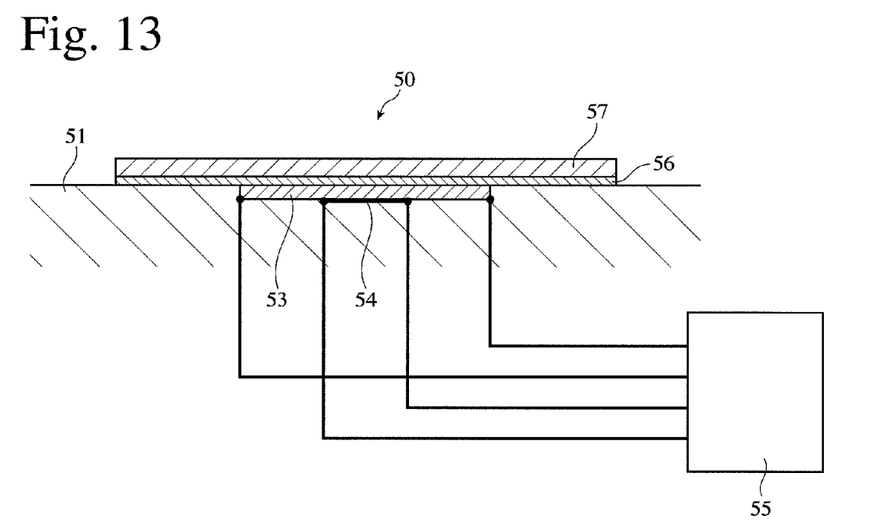
FIG. 13 is a schematic cross-sectional view showing a heat dissipation test apparatus of a heat-dissipating sheet.
Figure 14:
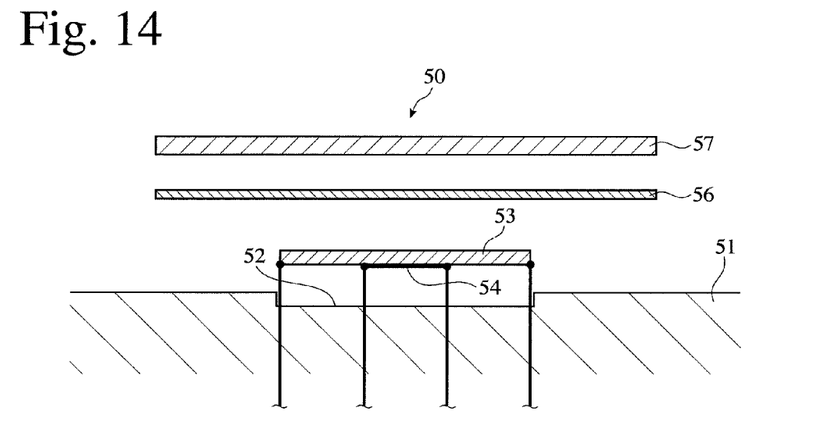
FIG. 14 is an exploded view of FIG. 13.

The heat dissipation test of the heat-dissipating sheet of the present invention may be conducted by an apparatus 50 shown in FIGS. 13 and 14. This heat dissipation test apparatus 50 comprises a heat-insulating, electric-insulating table 51 having an annular recess 52, a circular plate heater 53 received in the annular recess 52, temperature-measuring thermocouples 54 attached to a lower surface of the heater 53, a temperature controller 55 connected to the heater 53 and the temperature-measuring thermocouples 54, and a 1-mm-thick acrylic plate (100 mm×100 mm) 57 covering a test piece 56 of 50 mm×100 mm of the heat-dissipating sheet 1 placed on the table 51, at such a position that the heater 53 is located at a center of the acrylic plate 57. The test piece 56 has nine temperature-measuring points $t_0$-$t_8$ at positions shown in FIG. 15, a temperature measured at the point $t_0$ being the highest temperature (Tmax), an average of temperatures measured at the points $t_1$-$t_4$ being an intermediate temperature (Tm), an average of temperatures measured at the points $t_5$-$t_8$ being the lowest temperature (Tmin), and an average of Tm and Tmin being an average temperature (Tav).

The present invention will be explained in more detail with Examples below without intention of restricting the present invention thereto.

Example 1

100 parts by mass in total of 85% by mass of fine graphite particles (UP-35N available from Nippon Graphite Industries Ltd., ash: less than 1.0%, average size: 25 μm), 10% by mass of channel black (average primary particle size: 42 nm) and 5% by mass of ketjen black (EC600JD, average primary particle size: 34 nm, porosity: 80%) were mixed with 10 parts by mass of polymethylmethacrylate (PMMA) as an organic binder, and 600 parts by mass of a mixed solvent of xylene/isopropyl alcohol (mass ratio: 6/4) as an organic solvent, to prepare a dispersion of fine graphite particles, carbon black and an organic binder in an organic solvent (viscosity: 1200 cP). The composition of the dispersion comprised 12.0% by mass of fine graphite particles, 1.4% by mass of channel black, 0.7% by mass of ketjen black, 1.4% by mass of the organic binder, and 84.5% by mass of the organic solvent.

This dispersion was cast into a 1-mm-deep cavity 11a of a lower die plate 11 in the SUS-made planar die apparatus 10 shown in FIG. 3, and made to have the same thickness as the depth of the cavity 11a by a doctor blade method. The dispersion D was spontaneously dried for 30 minutes to form a resin-containing composite sheet R.

The resin-containing composite sheet R kept in the lower die plate 11 was introduced into an electric furnace, and burned at 650° C. for 10 minutes in an air atmosphere to remove the organic binder. The resultant composite sheet C of fine graphite particles and carbon black was gradually cooled over about 3 hours in the electric furnace.

The lower die plate 11 containing the composite sheet C of fine graphite particles and carbon black in the cavity 11a was combined with an upper die plate 12 having a complementary shape to the lower die plate 11, such that a projection 12a of the upper die plate 12 came into contact with the composite sheet C of fine graphite particles and carbon black, as shown in FIG. 10, and caused to pass through a gap between a pair of rolls 40, 40 rotating at a peripheral speed of 30 cm/minute 4 times, to press the composite sheet C of fine graphite particles and carbon black at linear pressure of 20 MPa or more each time, as shown in FIG. 11.

Figure 15:
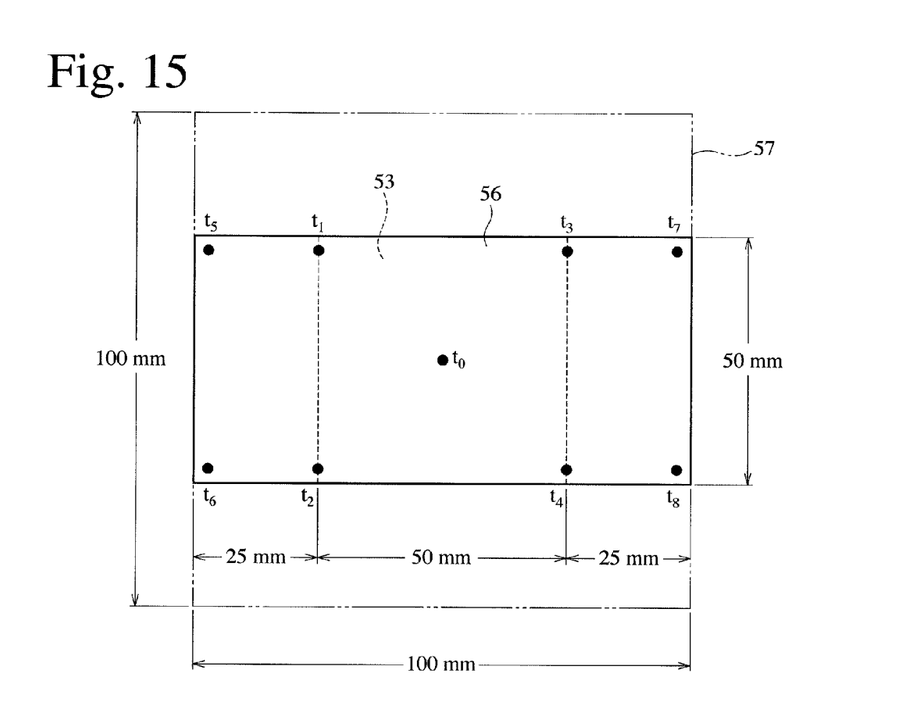
FIG. 15 is a plan view showing temperature-measuring points on a heat-dissipating sheet test piece set in a heat dissipation test apparatus.

After pressing, a heat-dissipating sheet 1 could be taken out of the cavity 11a of the lower die plate 11 without breakage. The heat-dissipating sheet 1 thus obtained had a thickness of 70 μm and a density of 2.17 g/cm$^3$. A test piece of 50 mm×100 mm was cut out of this heat-dissipating sheet 1, and set in the apparatus shown in FIGS. 13-15 to conduct a heat dissipation test at room temperature (26.1° C.). The test piece was heated at 72° C. (hot spot) by a ceramic heater 53 of 2.48 W (50 mm×50 mm). After reaching an equilibrium state, the temperature at each point of the heat-dissipating sheet test piece was as follows:

$t_0$: 48.8° C.,
$t_1$: 44.7° C.,
$t_2$: 44.3° C.,
$t_3$: 44.6° C.,
$t_4$: 43.8° C.,
$t_5$: 42.5° C.,
$t_6$: 42.2° C.,
$t_7$: 39.8° C., and
$t_8$: 39.9° C.

Thus, the highest temperature Tmax was 48.8° C. (hot spot), the intermediate temperature Tm was (44.7° C.+44.3° C.+44.6° C.+43.8° C.)/4=44.4° C., the lowest temperature Tmin was (42.5° C.+42.2° C.+39.8° C.+39.9° C.)/4=41.1° C., and the average temperature Tav was (Tm+Tmin)/2=42.8° C.

The thermal conductivity (W/mK) of the heat-dissipating sheet 1 was calculated as a product of thermal diffusivity (m$^2$/s) measured by a laser flash method and heat capacity (density×specific heat). The specific heat was regarded as 750. As a result, the thermal conductivity of the heat-dissipating sheet 1 was 660 W/mK in an in-plane direction and 10 W/mK in a thickness direction.

When this heat-dissipating sheet 1 was bent to 90° with a radius of curvature of 2 cm, no breakage occurred. The heat-dissipating sheet 1 cut by scissors had a clear-cut surface with no fine graphite particles and carbon black detached.

Example 2

A heat-dissipating sheet 1 was produced in the same manner as in Example 1 except for using channel black having an average primary particle size of 85 nm, and ketjen black (EC300J) having an average primary particle size of 40 nm and porosity of 60%, as carbon black. The heat-dissipating sheet 1 had an in-plane thermal conductivity of 600 W/mK. When this heat-dissipating sheet 1 was bent to 90° with a radius of curvature of 2 cm, no breakage occurred. The heat-dissipating sheet 1 cut by scissors had a clear-cut surface with no fine graphite particles and carbon black detached.

Example 3

A heat-dissipating sheet 1 was produced in the same manner as in Example 1 except for using channel black having an average primary particle size of 85 nm in place of channel black having an average primary particle size of 42 nm. The heat-dissipating sheet 1 had an in-plane thermal conductivity of 610 W/mK. When this heat-dissipating sheet 1 was bent to 90° with a radius of curvature of 2 cm, no breakage occurred. The heat-dissipating sheet 1 cut by scissors had a clear-cut surface with no fine graphite particles and carbon black detached.

Example 4

A heat-dissipating sheet 1 was produced in the same manner as in Example 1 except for changing the amount of ketjen black to 3% by mass. The heat-dissipating sheet 1 had an in-plane thermal conductivity of 640 W/mK. When this heat-dissipating sheet 1 was bent to 90° with a radius of curvature of 2 cm, no breakage occurred. The heat-dissipating sheet 1 cut by scissors had a nearly clear-cut surface, which was poorer than that of Example 1, with substantially no fine graphite particles and carbon black detached.

Example 5

A heat-dissipating sheet 1 was produced in the same manner as in Example 1 except for changing the amount of channel black to 15% by mass. The heat-dissipating sheet 1 had an in-plane thermal conductivity of 590 W/mK. When this heat-dissipating sheet 1 was bent to 90° with a radius of curvature of 2 cm, no breakage occurred. The heat-dissipating sheet 1 cut by scissors had a clear-cut surface with no fine graphite particles and carbon black detached.

Example 6

A heat-dissipating sheet 1 was produced in the same manner as in Example 1 except for changing the amount of ketjen black to 10% by mass. The heat-dissipating sheet 1 had an in-plane thermal conductivity of 580 W/mK. When this heat-dissipating sheet 1 was bent to 90° with a radius of curvature of 2 cm, no breakage occurred. The heat-dissipating sheet 1 cut by scissors had a clear-cut surface with no fine graphite particles and carbon black detached.

Example 7

A heat-dissipating sheet 1 was produced in the same manner as in Example 1 except for changing the amount of channel black to 5% by mass and the amount of ketjen black to 10% by mass. The heat-dissipating sheet 1 had an in-plane thermal conductivity of 630 W/mK. When this heat-dissipating sheet 1 was bent to 90° with a radius of curvature of 2 cm, no breakage occurred. The heat-dissipating sheet 1 cut by scissors had a clear-cut surface with no fine graphite particles and carbon black detached.

Example 8

A heat-dissipating sheet 1 was produced in the same manner as in Example 1 except for changing the amount of channel black to 5% by mass and the amount of ketjen black to 3% by mass. The heat-dissipating sheet 1 had an in-plane thermal conductivity of 650 W/mK. When this heat-dissipating sheet 1 was bent to 90° with a radius of curvature of 2 cm, no breakage occurred. The heat-dissipating sheet 1 cut by scissors had a nearly clear-cut surface, which was poorer than that of Example 1, with substantially no fine graphite particles and carbon black detached.

Example 9

A heat-dissipating sheet 1 was produced in the same manner as in Example 1 except for using acetylene black having an average primary particle size of 48 nm in place of ketjen black. The heat-dissipating sheet 1 had an in-plane thermal conductivity of 630 W/mK. When this heat-dissipating sheet 1 was bent to 90° with a radius of curvature of 2 cm, no breakage occurred. The heat-dissipating sheet 1 cut by scissors had a nearly clear-cut surface, which was poorer than that of Example 1, with substantially no fine graphite particles and carbon black detached.

Comparative Example 1

A heat-dissipating sheet 1 was produced in the same manner as in Example 1 except for using only 15% by mass of channel black having an average primary particle size of 42 nm as carbon black. The heat-dissipating sheet 1 had an in-plane thermal conductivity of 640 W/mK. However, when this heat-dissipating sheet 1 was bent to 90° with a radius of curvature of 2 cm, breakage sometimes occurred.

Comparative Example 2

A heat-dissipating sheet 1 was produced in the same manner as in Example 1 except for using only 15% by mass of ketjen black having an average primary particle size of 34 nm as carbon black. The heat-dissipating sheet 1 had an in-plane thermal conductivity of 610 W/mK. The heat-dissipating sheet 1 did not have strength necessary for handling, though no breakage occurred when it was bent to 90° with a radius of curvature of 2 cm.

Comparative Example 3

A heat-dissipating sheet 1 was produced in the same manner as in Example 1 except for changing the amount of channel black to 20% by mass and the amount of ketjen black to 10% by mass. The heat-dissipating sheet 1 had as low in-plane thermal conductivity as 550 W/mK.

With respect to the heat-dissipating sheets of Examples 1-9 and Comparative Examples 1-3, the compositions and thermal conductivities are shown in Table 1.

TABLE 1

| | Composition (% by mass) | | | | | | Thermal |
| | Graphite | CB[1] | | KB[2] | | AB[3] | Conductivity |
| No. | 25 μm | 42 nm | 85 nm | 34 nm | 40 nm | 48 nm | (W/mK) |
| --- | --- | --- | --- | --- | --- | --- | --- |
| Example 1 | 85 | 10 | — | 5 | — | — | 660 |
| Example 2 | 85 | — | 10 | — | 5 | — | 600 |
| Example 3 | 85 | — | 10 | 5 | — | — | 610 |
| Example 4 | 87 | 10 | — | 3 | — | — | 640 |
| Example 5 | 80 | 15 | — | 5 | — | — | 590 |
| Example 6 | 80 | 10 | — | 10 | — | — | 580 |
| Example 7 | 85 | 5 | — | 10 | — | — | 630 |
| Example 8 | 92 | 5 | — | 3 | — | — | 650 |
| Example 9 | 85 | 10 | — | — | — | 5 | 630 |
| Com. Ex. 1 | 85 | 15 | — | — | — | — | 640 |
| Com. Ex. 2 | 85 | — | — | 15 | — | — | 610 |
| Com. Ex. 3 | 70 | 20 | — | 10 | — | — | 550 |

Note:
[1]Channel black.
[2]Ketjen black.
[3]Acetylene black.

Conventional Example 1

The same heat dissipation test as in Example 1 was conducted on a graphite sheet PGS as thick as 70 μm (available from Panasonic Corporation). As a result, the temperature at each point of a test piece of the heat-dissipating sheet was as follows:

$t_0$: 48.4° C.,
$t_1$: 44.3° C.,
$t_2$: 43.9° C.,
$t_3$: 44.2° C.,
$t_4$: 43.4° C.,
$t_5$: 40.1° C.,
$t_6$: 38.0° C.,
$t_7$: 38.7° C., and
$t_8$: 36.8° C.

Thus, the highest temperature Tmax was 48.4° C. (hot spot), the intermediate temperature Tm was (44.3° C.+43.9° C.+44.2° C.+43.4° C.)/4=44.0° C., the lowest temperature Tmin was (40.1° C.+38.0° C.+38.7° C.+36.8° C.)/4=38.4° C., and the average temperature Tav was (Tm+Tmin)/2=41.2° C. Comparison with Example 1 revealed that the graphite sheet of Conventional Example 1 was poorer than that of Example 1 in any of the highest temperature Tmax, the lowest temperature Tmin and the average temperature Tav.

Example 10

Figure 16:
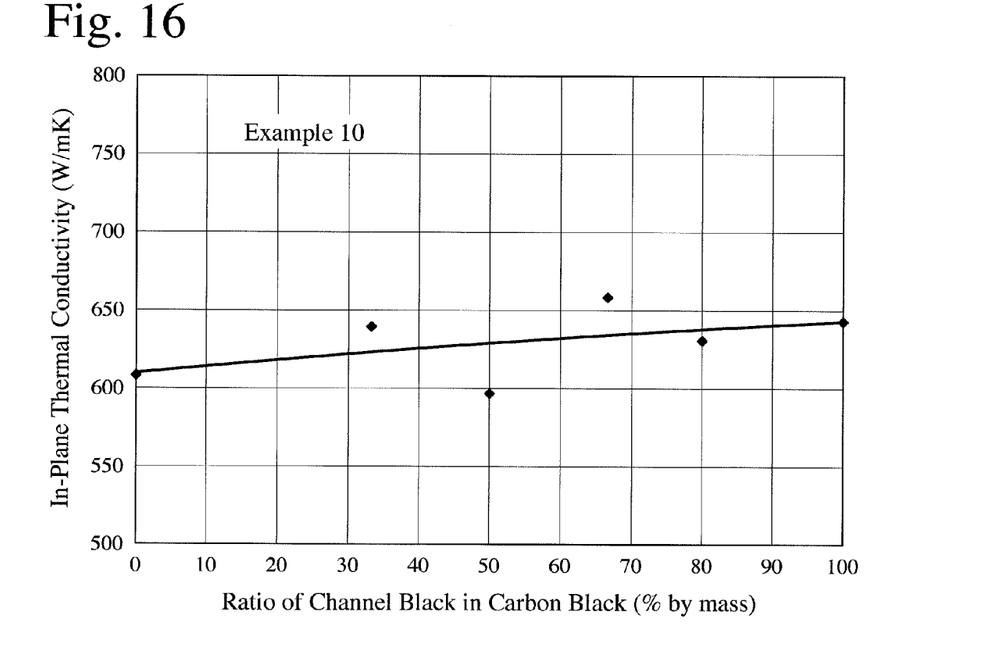
FIG. 16 is a graph showing the relation between the ratio of channel black in carbon black and in-plane thermal conductivity, in the heat-dissipating sheet of Example 10.

A heat-dissipating sheet 1 was produced in the same manner as in Example 1, except for changing the ratio (% by mass) of channel black in the carbon black. FIG. 16 shows the relation between thermal conductivity and the ratio of channel black in the heat-dissipating sheet 1. It is clear from FIG. 16 that a higher ratio of channel black provides higher thermal conductivity. However, when the carbon black was composed only of channel black, the heat-dissipating sheet 1 was broken when bent to 90° with a radius of curvature of 2 cm. This indicates that the carbon black should be composed of not only channel black but also ketjen black (and/or acetylene black).

Example 11

A heat-dissipating sheet 1 was produced in the same manner as in Example 1, except that freezing was conducted at −5° C. for 30 minutes after burning the resin-containing composite sheet R. The resultant heat-dissipating sheet 1 had higher in-plane thermal conductivity than that of Example 1. When the heat-dissipating sheet 1 of Example 11 was bent to 90° with a radius of curvature of 2 cm, no breakage occurred as in Example 1. As in Example 1, the heat-dissipating sheet 1 cut by scissors had a clear-cut surface, with no fine graphite particles and carbon black detached.

EFFECTS OF THE INVENTION

Because the heat-dissipating sheet of the present invention has a structure in which carbon black is uniformly dispersed among fine graphite particles, a mass ratio of fine graphite particles to carbon black being 75/25 to 95/5, and the carbon black being composed of channel black and ketjen black and/or acetylene black, it has a density of 2.0 g/cm³ or more and an in-plane thermal conductivity of 580 W/mK or more. Also, because carbon black composed of fine channel black and fine ketjen black and/or acetylene black is uniformly dispersed among fine graphite particles, the heat-dissipating sheet of the present invention has uniform thermal conductivity as well as sufficient mechanical properties for handling. Such a uniform, high-density heat-dissipating sheet is obtained, by forming a resin-containing composite sheet comprising uniformly dispersed fine graphite particles and carbon black from a dispersion comprising fine graphite particles, carbon black and an organic binder, burning the resin-containing composite sheet to remove the organic binder, and then pressing it for densification.

Because the heat-dissipating sheet of the present invention is produced by a low-cost process of applying, burning and pressing a relatively inexpensive material comprising fine graphite particles and carbon black, it is advantageously inexpensive, with as high in-plane thermal conductivity as 580 W/mK or more and sufficient mechanical properties for handling. The heat-dissipating sheet of the present invention having such feature is suitable for small electronic appliances such as note-type personal computers, smartphones, mobile phones, etc.

What is claimed is:

1. A heat-dissipating sheet consisting essentially of fine graphite particles and carbon black uniformly dispersed among fine graphite particles;
    a mass ratio of fine graphite particles to carbon black being 75/25 to 95/5;
    said carbon black being composed of channel black and at least one of ketjen black and acetylene black:
    a mass ratio of channel black to at least one of ketjen black and acetylene black being 4/1-1/3:
    said fine graphite particles having an average diameter of 3-150 μm and average thickness of 200 nm or more;
    said carbon black having an average primary particle size of 20-200 nm;
    whereby said heat-dissipating sheet has a density of 2.0 g/cm³ or more and an inplane thermal conductivity of 580 W/mK or more.

2. The heat-dissipating sheet according to claim 1, wherein thickness of the heat-dissipating sheet is 25-150 μm.

3. The heat-dissipating sheet according to claim 1, which is coated with insulating resin layers or insulating plastic films.

* * * * *